United States Patent [19]

Hayashi et al.

[11] Patent Number: 4,644,091
[45] Date of Patent: Feb. 17, 1987

[54] PHOTOELECTRIC TRANSDUCER

[75] Inventors: Yutaka Hayashi, Sakuramura; Hideyo Iida, Takasaki; Toshio Mishuku, Yoshimachi, all of Japan

[73] Assignee: Taiyo Yuden Kabushiki Kaisha, Tokyo, Japan

[21] Appl. No.: 645,059

[22] Filed: Aug. 28, 1984

[30] Foreign Application Priority Data

Aug. 29, 1983 [JP] Japan ................ 58-157489

[51] Int. Cl.⁴ .................................. H01L 31/06
[52] U.S. Cl. ........................... 136/259; 136/256; 136/258; 357/30; 357/55; 357/59
[58] Field of Search ............ 136/255, 256, 258 AM, 136/259; 357/30, 55, 59 C

[56] References Cited

U.S. PATENT DOCUMENTS

4,554,727 11/1985 Deckman et al. .................. 29/572
4,571,448 2/1986 Barnett .............................. 136/259

FOREIGN PATENT DOCUMENTS

55-108780 8/1980 Japan .................................. 136/259
57-49278 3/1982 Japan .................................. 136/259
59-123283 7/1984 Japan .

OTHER PUBLICATIONS

H. W. Deckman et al, "Fabrication of Optically Enhanced Thin Film a-Si-H$_x$ Solar Cells", *J. Vac. Sci. Technol.*, vol. A1(2), Apr.-Jun. 1983, pp. 578-582.
"Enhanced Optical Absorption Produced by Light Trapping in Amorphous Silicon Films", by T. Tiedje et al, presented at 16th IEEE Photovoltaic Specialists Conference, Sep. 27-30 (1982), pp. 1423-1424.
"Optical Enhancement of a-SiH$_x$ Solar Cells", by H. Deckman et al, presented at 16th IEEE Photovoltaic Specialists Conference, Sep. 27-30 (1982), pp. 1425-1426.

*Primary Examiner*—Aaron Weisstuch
*Attorney, Agent, or Firm*—Michael N. Meller

[57] ABSTRACT

A photoelectric transducer comprising at least a light-transmissive substrate having a relatively flat surface provided on its light-receiving side and an uneven surface provided on its opposite side, and a photoelectric transducing layer provided on the uneven surface of the substrate. The photoelectric transducing layer comprises at least a light-transmissive conductive layer, a semiconductor layer, and a back conductive electrode layer. The back conductive electrode layer comprises a second light-transmissive conductive layer and a conductive layer. The uneven surface on the substrate includes numerous projections, each projection having a triangular section and a shape of pyramidal, ridged roof, or conical type. The projections and the second light-transmissive conductive layer of the uneven back conductive electrode layer elongate the optical path of light beams in the photoelectric transducing layer, and prevent the adherence of dust particles and the abrasion of the photoelectric transducing layer.

5 Claims, 4 Drawing Figures

PHOTOELECTRIC TRANSDUCER

TECHNICAL FIELD OF THE INVENTION

This invention relates to a thin-film photoelectric transducer, and is more particularly directed to a thin-film photoelectric transducer having a structure which produces a lengthened optical path for improving the optical absorption property thereof.

BACKGROUND OF THE INVENTION

In order to improve the conversion efficiency of a photoelectric transducer such as a solar battery or the like, it is necessary that a semiconductor material for effecting photoelectric conversion have a large optical absorption coefficient, and that a change carrier (electron, positive hole) generated by the material's absorption of optical energy have a long lifetime and a large mobility or diffusion length. Additionally, for minimizing the reflection of light incident thereon, usually an antireflection coating film is applied to the surface of the transducer or the surface on the light-receiving side of the semiconductor substrate is formed into an uneven surface. In particular, a reflection-reducing type solar battery has been put to practical use in which the surface comprising a (100) plane of a silicon substrate is formed into a textured surface comprising innumerable pyramidal projections by a selective etching technique using an alkaline solution.

FIG. 1 shows a sectional view of part of a conventional reflection-reducing type photoelectric transducer for use as a solar battery. The photoelectric transducer comprises the semiconductor substrate 10, having a junction-forming layer 20 applied thereon. Layer 20 comprises a number of projections 30 forming the uneven light-receiving surface of the photoelectric transducer. The arrows in FIG. 1 denote the respective paths of the reflected and refracted portions of a beam of light incident on the uneven surface.

In general, a thin-film photoelectric transducer such as an amorphous semiconductor solar battery, a thin-film optical sensor, or the like has low carrier mobility and a short carrier lifetime. Accordingly, even if the film thickness of the semiconductor constituting the solar battery, for instance, is increased beyond that required for the purpose of improving the optical absorption property thereof, the photoelectric conversion rate thereof as measured by the electric output cannot be increased. The effective increase in the film thickness of the semiconductor is at best about two times a carrier lifetime travel distance (diffusion length + built-in electric field × mobility × lifetime), and if the increase in thickness is more than that, a lowering of the output results.

Accordingly, how to lengthen the optical path in the thin film is one of the key questions in designing for improved conversion efficiency.

The prior art uneven surface configuration on the light incident side seems to be ideal for preventing the reflection of light incident thereon, but is defective in that the uneven surface is liable to be adhered to by dust particles or to be abraded during use of the transducer for a long period of time, and this results in a remarkable decrease in its properties.

SUMMARY OF THE INVENTION

The object of this invention is to provide a thin-film photoelectric transducer that does not suffer from this disadvantageous decrease in its properties caused by adhesion of dust particles or abrasion and which has a construction which produces a longer optical path in the semiconductor thin film. The invention is characterized in that it comprises at least a light-transmissive substrate having a comparatively flat surface provided on its light-receiving side, an uneven surface provided on its opposite side and a photoelectric transducing layer provided on the uneven surface.

Thus, by the above construction, the optical path length can be increased, resulting in an improved optical absorption property and accordingly an improved photoelectric conversion efficiency. In addition, any decrease in characteristics due to the adhesion of dust or abrasion of the surface of the photoelectric transducing layer can be prevented.

BRIEF DESCRIPTION OF THE DRAWINGS

The preferred embodiment of the invention will be described with reference to the following drawings.

DETAILED DESCRIPTION OF THE PREFERRED EMBODIMENTS

Figure 1:
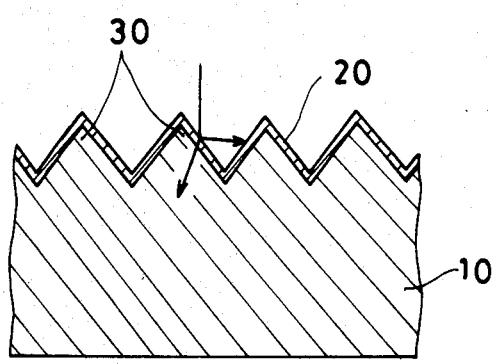
FIG. 1 is a sectional view of a prior art reflection-reducing solar battery.
Figure 2:
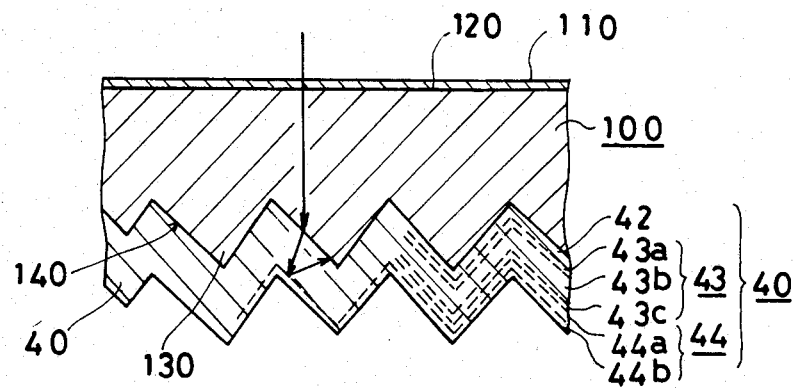
FIG. 2 is a sectional view of a preferred embodiment of this invention.

FIG. 2 shows a photoelectric transducing layer 40 applied on a light-transmissive substrate 100. Transmissive substrate 100 has a light-receiving surface 120 on which an antireflection coating film 110 with a refractive index nearer to that of air than that of substrate 100 is formed. The transmissive substrate 100 has, on the side opposite to the light-receiving surface 120, an uneven surface 140 comprising numerous projections 130. Substrate 100 may be a glass plate, a plastic film, or the like. The object of this invention can be achieved not only by providing a transmissive substrate which is transparent when viewed optically but also by making the transmissive substrate out of any material that allows light of wavelengths that can be converted into electricity to pass therethrough.

A simple solar cell could have a construction such that the photoelectric transducing layer 40 is composed of a single semiconductor layer which is provided at a predetermined portion with an electrode. This type of photoelectric transducer utilizes changes in photoconductivity in relation to light incidence, such as in a photoconductive cell or the like. In the case of an amorphous silicon solar battery in accordance with the invention, however, the photoelectric transducing layer thereof is typically a multiple-layer construction which comprises, as shown in FIG. 2, a light-transmissive conductive layer 42, a semiconductor layer 43 composed of a p-type amorphous layer 43a, an intrinsic amorphous silicon layer 43b without any impurity substance added thereto, an n-type amorphous layer 43c and a back conductive electrode layer 44 comprising a second light-transmissive conductive layer 44a and a conductive layer 44b made of a thin metallic film. Furthermore, the semiconductor layer 43 may be of a multiple-layer construction of tandem or pin, pin, . . . type which comprises various layers such as of amorphous silicon carbide, amorphous silicon nitride, amorphous silicon germanium, or the like. The transmissive conductive layer 42 need not always be made of an optically transparent substance, and it is sufficient if layer allows the useful wavelengths of light to pass therethrough. Therefore, the term "a light-transmissive conductive layer" as used herein includes either of the above types. The back conductive electrode layer 44 is so arranged that the second light-transmissive conductive layer 44a may be interposed between the thin metallic film, that is, the conductive layer 44b thereof and the conductor layer 43. In addition, the limitation with respect to the apex angle of a projection may be relaxed, as will be explained in detail hereinafter. As mentioned above, the main object of this invention is to improve the photoelectric conversion efficiency by lenghtening the optical path of light incident thereon. In what follows, a triangular shape of the projection will be described that is effective in achieving the desired lengthening of the optical path.

Figure 3:
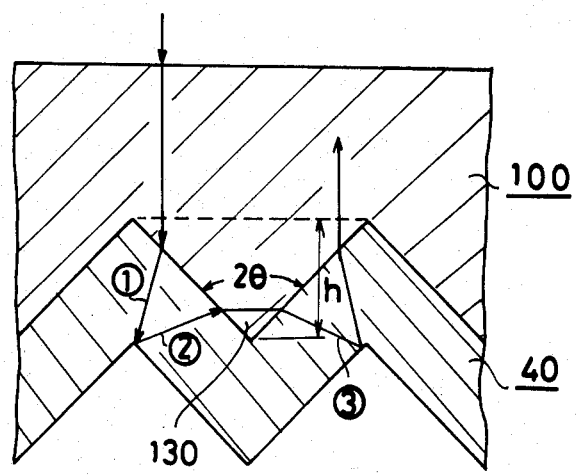
FIGS. 3 and 4 are sectional views showing the principle of this invention.

FIG. 3 shows one example of the optical path of light incident on a transducer made in accordance with the invention wherein the apex angle $2\theta$ of a projection of the transmissive substrate 100 is 90 degrees. In this case, the photoelectric transducing layer 40 comprises multiple layers which have different refractive indices, but which can be considered as equivalent to one layer having a single refractive index.

In FIGS. 2 and 3, the same reference numerals denote like parts.

A light beam which is comparatively long in wavelength and is transmitted through the transmissive substrate 100, is incident on the photoelectric transducing layer 40 but is not fully absorbed in the semiconductor layer 43 of layer 40. The beam is reflected at the back surface of the layer 40 and at the conductive layer 44b of the back conductive electrode layer 44, and is returned to the transmissive substrate 100. In this case, if the transmissive substrate 100 is formed so as to cause this returned light to again impinge on the photoelectric transducing layer 40, the photoelectric conversion efficiency thereof with respect to long-wavelength light can be remarkably improved. Through many experiments, it has been found that an apex angle $2\theta$ of the projection 130 equal to 90 degrees or less will allow the returned light to again impinge on the photoelectric transducing layer 40.

Assuming that the incident light beam impinges on the light-receiving surface 120 of the transmissive substrate 100 at a 90 degree angle, it will pass through the transmissive substrate 100 and into the photoelectric transducing layer 40. The beam is reflected at the back surface of the photoelectric transducing layer 40 and returned to the substrate 100, the returned light traveling in parallel with the light-receiving surface 120 of substrate 100 if $2\theta = 90$ degrees and traveling downward if $2\theta < 90$ degrees. Consequently, the returned light in the projection 130 is again incident on the photoelectric transducing layer 40, so that a lengthened optical path ③ is thereby achieved in layer 40.

In this case, almost the same lengthening of the optical path can be obtained with a projection having a triangular cross section, the projection being pyramidal, having a ridged roof having ridges that cross one another, or being conical. Additionally, it has been found that almost the same effect can be obtained as long as the apex angle $2\theta$ of each of the projections is 90 degrees or less, even if the individual projections of the uneven surface of the substrate are different in height.

Next, a specific method of producing the photoelectric transducer of this invention will be described.

A glass plate is formed with an uneven surface comprising a number of ridged roof-type projections, and a 2000-Å-thick tin oxide film is formed on the uneven surface by a chemical vapor deposition process performed at a substrate temperature of 400° C. using $SnCl_4$ and water vapor. By a glow discharge decomposition of monosilane (using a gas mixture wherein $B_2H_6$ is added to the monosilane in the amount of 0.5%) a 100-Å-thick p-type amorphous silicon layer, a 5000-Å-thick amorphous silicon layer without any impurity substance added, and a 300-Å-thick n-type amorphous silicon layer (using a gas mixture wherein $PH_3$ is added to the monosilane in the amount of 1%) are formed on the oxide film at a growth temperature of 250° C. In addition, a nickel layer having a thickness of about 5000 Å is formed thereon by a vacuum vapor deposition process, whereby a photoelectric transducer suitable for an amorphous silicon solar battery is produced. It has been found by a comparison test that the conversion efficiency of this solar battery for light of wavelength 700–800 nm is increased by about 50% as compared with that of a similar transducer having the same construction as above except that the glass plate lacks an uneven surface, in the case where the apex angle of each projection is 90 degrees or less, regardless of any change in the height of the projections.

When a photoelectric transducer is produced in which the apex angle $2\theta$ of a projection is 90 degrees or less as mentioned above, the efficiency of the transducer can be improved by rounding off the apex of the projections. However, in the case where the vapor deposition process is used, it is preferable that the apex angle of the projections be obtuse.

Figure 4:
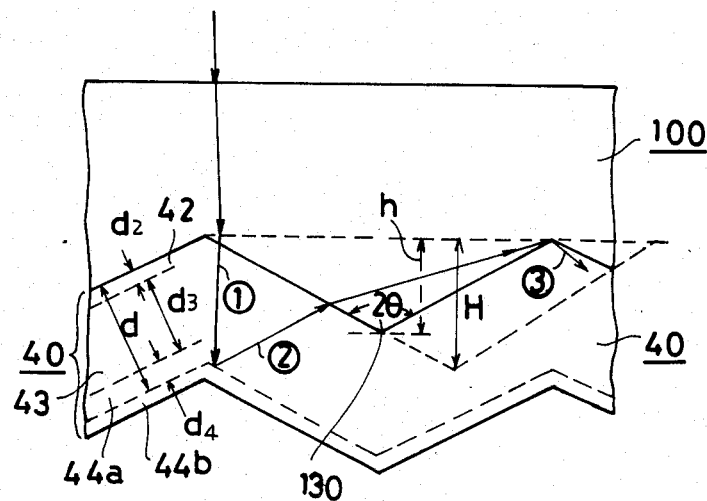

However, in the case where the apex angle is obtuse, there is no assurance that all the light beams returned to the transmissive substrate 100 by reflection at the back surface of the photoelectric transducing layer 40 will enter the photoelectric transducing layer 40 a second time. If the height H of the projection with an obtuse angle as shown in FIG. 4 is larger than a predetermined height h, the light returned to the transparent substrate 100 will not reenter the photoelectric transducing layer 40. Accordingly, as the height H is increased, the number of light beams which miss the photoelectric transducing layer is increased.

This will be easily understood if, in FIG. 4, a projection having a height H larger than the predetermined height h, as shown by dashed lines, is considered. In the case where the projection has the predetermined height h, the incident light travels in the photoelectric transducing layer 40 so as to pass through the semiconductor layer 43 and the second light-transmissive layer 44a and be reflected at the conductive layer 44b along the incident and reflected optical paths ① and ② and is then returned to the transparent substrate 100. In this case the returned light beam enters the transducing layer 40 again, thereby producing an additional optical path ③ in the layer 40. Accordingly, in the case where the apex angle $2\theta$ is obtuse, the height H of the projection must be below a predetermined value h and only under this condition will all of the incident light beams which are returned to the substrate 100 reenter the layer 40, thereby producing an optical path in the photoelectric transducing layer 40 which is greater than the optical path ① + ② (in FIG. 4).

This predetermined height h can be determined by the following formula:

$$h = \frac{(x-y)\cos\theta}{2} + \left[(x-y)\cos\theta + \frac{y}{\cos\theta}\right]\frac{\tan(180°-2\theta)}{2\tan\theta} \quad (1)$$

Here, $$x = \frac{d_2 + d_3 + \ldots + d_i}{\tan\theta} \quad (2)$$

$$y = d_2\left(\frac{n_1}{n_2}\cos\theta\right)\left[1 - \left(\frac{n_1}{n_2}\cos\theta\right)^2\right]^{-\frac{1}{2}} + \quad (3)$$

$$d_3\left(\frac{n_1}{n_3}\cos\theta\right)\left[1 - \left(\frac{n_1}{n_3}\cos\theta\right)^2\right]^{-\frac{1}{2}} + \ldots +$$

$$d_i\left(\frac{n_1}{n_i}\cos\theta\right)\left[1 - \left(\frac{n_1}{n_i}\cos\theta\right)^2\right]^{-\frac{1}{2}}$$

In Equations (2) and (3), $d_2, d_3, \ldots, d_i$ and $n_1, N_2, \ldots, n_i$ are respectively the thicknesses and refractive indices of the respective layers such as conductive layer 42, semiconductor layer 43, and others forming the photoelectric transducing layer 40. In addition, $n_1$ is the refractive index of the transparent substrate 100.

In order that the incident light be refracted at the projection of obtuse angle, the length of the base of the projection must be greater than $\lambda/4n_1$ ($\lambda$ is the wavelength of light in air), and accordingly the height h of the projection must be greater than $\lambda/(8n_1 \tan\theta)$.

In the case of a specific amorphous silicon solar battery comprising a transmissive substrate 100 made of glass and the above respective films of the foregoing thicknesses produced as described above, if the apex angle $2\theta$ of the projection is 120 degrees, the upper limit of the height thereof is about 0.35 micron. However, if the transmissive conductive layer 44a is interposed between the semiconductor layer 43 and the back conductive electrode layer 44, the upper limit of the height thereof can be relaxed. For instance, if a 3000-Å-thick indium oxide film is interposed therebetween, the upper limit thereof can be increased to 0.58 micron.

If the film thickness of the photoelectric transducing layer 40 is so large or the height of the projection is so small that the optical path ② does not enter the projection 130, but rather travels under the projection, the optical path ②, that is, the reflected light beam traveling in the photoelectric transducing layer 40, can be lengthened.

A second preferred embodiment of this invention is produced as follows:

A 0.5-mm-thick glass substrate (Corning glass #7059) is ground, employing abrasive alumina particles with diameters of less than 1 micron, and thereafter the apices of the projections thus formed are rounded with an etching solution prepared by diluting hydrofluoric acid with pure water. The resulting substrate surface was observed with an electron microscope, which revealed that the heights of the projections are in the range of 0.1-1 micron, the bases of the projections (one side of the square bottoms of the pyramidal projections) are in the range of 0.1-1 micron, and the apex angles of the projections are in the range of about 60-120 degrees. Of these projections, 15% have an acute apex angle ranging from 60 to 90 degrees and 85% have an obtuse apex angle ranging from 90 to 120 degrees. The projections having an obtuse apex angle are 0.1-0.5 micron in height.

A solution prepared by dissolving in $SnCl_4 \cdot 5H_2O$ and $SbCl_4$ in alcohol is sprayed onto the foregoing two glass substrates and a glass substrate which is not ground with abrasive, and a 1500-Å-thick tin oxide film is grown thereon at a substrate temperature of 400° C. Then, an amorphous silicon layer is deposited on each of these three substrates in a parallel-plate glow discharge decomposition apparatus. A p-layer is grown such that the ratio of $B_2H_6/SiH_4$ is 1/200 (i.e. 0.5%) and the ratio of $SiH_4/CH_4$ is 7/3, using as a raw material 10% $SiH_4$ gas diluted with hydrogen and 1000 ppm of $B_2H_6$ diluted with hydrogen and $CH_4$. Thereafter, an i-layer is grown using 10% $SiH_4$ gas diluted with hydrogen and an n-layer is grown such that the ratio of $PH_3/SiH_4$ is 1/200 (i.e. 0.5%) using as a raw material 1000 ppm of $PH_3$ gas diluted with hydrogen.

The film thicknesses of the respective layers thus obtained are 100 Å, 5000 Å, and 300 Å. In this case, the temperature of each substrate is 250° C. and the electric power of the glow discharge is 0.1 W/cm².

Of the three substrates prepared in the above-described manner, two substrates (one substrate subjected to grinding and one substrate not subjected to grinding) are so provided that a 3000-Å-thick film of indium oxide (containing 5% tin) may be formed on each by an electron beam deposition process. Additionally, all three substrates are so provided that a silver film about 1 micron in thickness is formed thereon by a vapor deposition process to produce respective transducers. These transducers, each being a square of 2 mm × 2 mm, were measured to determine the characteristic properties. The light used for the measurement is an artificial sunlight of 100 mW/cm² intensity having a spectrum of AM1. The characteristic properties were as follows:

|  | Short-circuit current (mA/cm²) | Open-circuit voltage (V) | Fill factor | Conversion efficiency (%) |
| --- | --- | --- | --- | --- |
| Transducer 1 | 19.6 | 0.82 | 0.60 | 9.6 |
| Transducer 2 | 17.8 | 0.82 | 0.60 | 8.7 |
| Transducer 3 | 14.2 | 0.85 | 0.61 | 7.3 |

Transducer 3 comprises a glass substrate that does not have an uneven surface. Transducers 1 and 2 comprise glass substrates that do have an uneven surface. Furthermore, in transducer 1 a transparent conductive layer of indium oxide is interposed between the amorphous silicon layer and the silver electrode. Thus, in each of transducers 1 and 2, the optical path of a long-wavelength light beam is largely lengthened at the projections of acute apex angle and at the projections of obtuse apex angle and small height, so that an increase in short-circuit current can be obtained. In this case, since transducer 1 is provided with the second transmissive conductive layer, the short-circuit current is higher than that of transducer 2. The sectional profile of the uneven surface of the glass substrate of each of transducers 1 and 2 has been observed with a scanning electron microscope, whereby it has been confirmed that the heights and the apex angles of almost all of the projections thereof satisfy formula (1).

Thus, this invention can bring about the various effects described below, thereby producing a photoelectric transducer which is high in conversion efficiency, stable in operation, and low in price.

(a) Since the surface of the transmissive substrate is uneven on the side opposite to the light-receiving surface the uneven surface can serve to prevent the adherence of dust to and the abrasion of the photoelectric transducing layer. The uneven surface also serves to lengthen the optical path of light entering the transducing layer, so that a photoelectric transducer which is high in photoelectric conversion efficiency is obtained.

(b) Since the apex angle of each of the projections forming the uneven surface of the substrate is 90 degrees or less, a lengthened optical path can be obtained in the photoelectric transducing layer which in turn results in a higher photoelectric conversion efficiency.

(c) Since the apex angle of the projection is obtuse and at the same time the height of the projection is set below a predetermined value determined by formula (1), the increase of the optical path of all of the light beams entering the transducing layer can be assured. In addition, when the obtuse apex angle of the projection is increased the formation of the back surface of the photoelectric transducing layer is made easier. At the same time the reflection of light at the back surface of the photoelectric transducing layer is increased and the amount of the reflected light confined in the transducing layer without leaking outside is increased, so that optical absorption in the transducing layer is increased.

(d) By interposing a transmissive conductive layer between the semiconductive layer and the back electrode layer, the reflection rate at the back surface of the photoelectric transducing layer is increased and the upper limit of the height of the projection is relaxed, thereby rendering the production of this inventive transducer easier. In addition, a mutual solid-phase diffusion or alloying at a high temperature between the back conductive electrode (in the case of metal) and the semiconductive layer can be prevented.

(e) The formation of the uneven surface of the transmissive substrate is made easy and even if the film thickness of the semiconductive layer is made thinner in order to prevent light-induced deterioration of the amorphous thin film of the photoelectric transducer of this invention, the photoelectric conversion efficiency thereof is not diminished.

(f) Since the uneven back conductive electrode layer of the photoelectric transducing layer provided on the uneven surface on the reverse side of the light-transmissive substrate comprises the second light-transmissive conductive layer and the conductive layer, the light paths in the semiconductive layer can be increased, i.e. lengthened.

The foregoing description of the preferred embodiments is presented for illustrative purposes only and is not intended to limit the scope of the present invention as recited in the appended claims. Modifications may be readily effected by one having ordinary skill in the art without departing from the spirit and scope of the inventive concept herein disclosed.

What is claimed is:

1. A photoelectric transducer which comprises at least a light-transmissive substrate having a substantially flat surface provided on its light-receiving side, an uneven surface provided on its side opposite to said light-receiving side and a photoelectric transducing layer provided on the uneven surface of said substrate, wherein said photoelectric transducing layer comprises at least a first light-transmissive conductive layer formed on said uneven surface of said substrate, a semiconductor layer formed on said first light-transmissive conductive layer and a back conductive layer formed on said semiconductor layer, said back conductive layer in turn comprising a second light-transmissive conductive layer formed on said semiconductor layer and a conductive layer formed on said second light-transmissive conductive layer, and said uneven surface includes a large number of projections, each of said projections having a triangular section an apex angle of which is greater than 90 degrees and a height h of which is less than $$\frac{(x-y)\cos\theta}{2} + \left[(x-y)\cos\theta + \frac{y}{\cos\theta}\right]\frac{\tan(180° - 2\theta)}{2\tan\theta}$$

where $x = (d_2 + d_3 + \ldots + d_i)/\tan\theta$, $y = d_2(n_1/n_2)\cos\theta[1 - (n_1/n_2)^2(\cos\theta)^2]^{-\frac{1}{2}} +$
$\qquad d_3(n_1/n_3)\cos\theta[1 - (n_1/n_3)^2(\cos\theta)^2]^{-\frac{1}{2}} + \ldots +$
$\qquad\qquad d_i(n_1/n_i)\cos\theta[1 - (n_1/n_i)^2(\cos\theta)^2]^{-\frac{1}{2}}$, $n_2, n_3, \ldots, n_i$ are the refractive indices of the respective layers of said photoelectric transducing layer except said conductive layer; $d_2, d_3, \ldots, d_i$ are the thicknesses of the respective layers of said photoelectric transducing layer except said conductive layer; and $n_1$ is the refractive index of the transparent substrate; such that reflected light from said back conductive layer re-enters said semiconductor layer through said projections on said transducing layer, resulting in increase in the amount of light in said photoelectric transducing layer.

2. A photoelectric transducer as defined in claim 1, wherein the height h of each of said projections of the uneven surface is greater than $\lambda/(8n_1 \tan\theta)$.

3. A photoelectric transducer as defined in claim 1, wherein the height h and the length of the base of each of said projections are respectively equal to 0.1–1.0 micron.

4. A photoelectric transducer as defined in claim 1, wherein said light-transmissive substrate is made of glass.

5. A photoelectric transducer as defined in claim 1, wherein said conductive layer of said back conductive electrode layer is made of metal.

* * * * *